(12) United States Patent  
Bui (10) Patent No.: US 7,109,770 B1  
(45) Date of Patent: Sep. 19, 2006

(54) PROGRAMMABLE AMPLIFIERS WITH POSITIVE AND NEGATIVE HYSTERESIS

(75) Inventor: John H. Bui, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/796,500

(22) Filed: Mar. 8, 2004

(51) Int. Cl.
*H03K 3/12* (2006.01)

(52) U.S. Cl. ........................... 327/205; 327/206

(58) Field of Classification Search ............... 327/205, 327/206
See application file for complete search history.

(56) References Cited

U.S. PATENT DOCUMENTS

| | | | |
|---|---|---|---|
| 4,072,870 A | 2/1978 | Davis | |
| 4,820,937 A | 4/1989 | Hsieh | |
| 5,264,740 A | 11/1993 | Wright | |
| 5,528,185 A * | 6/1996 | Lewicki et al. | 327/206 |
| 5,990,708 A | 11/1999 | Hu | |
| 6,087,873 A * | 7/2000 | Alexander | 327/206 |
| 6,377,108 B1 | 4/2002 | Kennedy | |
| 6,566,926 B1 | 5/2003 | Patterson | |

* cited by examiner

*Primary Examiner*—Kenneth B. Wells
(74) *Attorney, Agent, or Firm*—Townsend and Townsend and Crew LLP (57) ABSTRACT

Programmable dynamic amplifiers with hysteresis are provided. The hysteretic amplifiers have a first input voltage threshold when the output voltage is at a high voltage and a second input voltage threshold when the output voltage is at a low voltage. A multiplexer controls the hysteretic threshold voltages in response to the output signal of the amplifier. The hysteretic amplifiers can be programmed to have positive or negative hysteresis. When the amplifier is programmed with positive hysteresis, the output voltage transitions after the input voltages have both reached a common voltage value. When the amplifier is programmed with negative hysteresis, the output voltage transitions before the input voltages have both reached a common voltage value.

15 Claims, 8 Drawing Sheets

PROGRAMMABLE AMPLIFIERS WITH POSITIVE AND NEGATIVE HYSTERESIS

BACKGROUND OF THE INVENTION

The present invention relates to programmable amplifiers with hysteresis, and more particularly, to amplifiers with that can be programmed to have positive and negative hysteretic threshold voltages.

Integrated circuits often have input buffers that receive input signals and drive signals to other parts of the integrated circuit. A differential input buffer senses differential input signals, converts the input signals to digital logic, and drives internal and external signals appropriately. One type of differential input buffer can drive input voltages that are generated according to the Low Voltage Differential Signal (LVDS) and Lightning Data Transport (LDT) differential input standards. To support other types of input voltage standards, extra circuitry and control RAM bits need to be added to this type of input buffer.

It would therefore be desirable to provide an input buffer that can support numerous differential input standards without the need for external components or additional internal circuitry. It would also be desirable to provide an input buffer that can sense a wider range of differential input voltages and common mode voltage levels than prior art input buffers. It would also be desirable to provide an input buffer that can be fabricated according to a wide range of semiconductor processes and that can operate within a wide range of supply voltages. It would also be desirable to provide an input buffer with these features and that can be easily maintained at a 50% duty cycle.

BRIEF SUMMARY OF THE INVENTION

The present invention provides programmable amplifiers with hysteresis. The amplifiers have two hysteretic input thresholds. A hysteretic amplifier of the present invention has a first input threshold when the output signal is at a high voltage. The hysteretic amplifier has a second input threshold when the output signal is at a low voltage. A multiplexer controls the hysteretic thresholds in response to the output signal of the amplifier.

A hysteretic amplifier of the present invention can be programmed to have positive or negative hysteresis. When the amplifier is programmed with positive hysteresis, the output voltage transitions at two hysteretic thresholds that occur after the input voltages have both reached a common voltage value. When the amplifier is programmed with negative hysteresis, the output voltage transitions at two hysteretic thresholds that occur before the input voltages have both reached a common voltage value.

According to one embodiment, a programmable hysteretic amplifier of the present invention can be used as an input buffer for an input signal applied to an input pin of an integrated circuit. According to another embodiment, three programmable hysteretic amplifiers of the present invention are coupled together to provide improved sensing of small differential input voltages. The first two amplifiers receive the input signals. Outputs of these two amplifiers drive the inputs of the third amplifier.

Other objects, features, and advantages of the present invention will become apparent upon consideration of the following detailed description and the accompanying drawings, in which like reference designations represent like features throughout the figures.

DETAILED DESCRIPTION OF THE INVENTION

The present invention provides amplifiers that have programmable hysteresis. The amplifiers of the present invention use dynamic hysteresis control to filter out noise or to speed up the data path. The hysteretic voltage thresholds of the amplifier can be selected by connecting select signals to the high or low voltages (e.g., the supply voltages). The hysteretic voltage thresholds can also be programmed by a user. A dynamic hysteretic amplifier of the present invention is preferably used to amplify differential input voltages.

A programmable hysteretic amplifier of the present invention can be used as a differential input buffer that drives input signals at a pin of an integrated circuit. As a differential input buffer, the programmable hysteretic amplifier can support numerous differential input standards such as LVDS, LDT, LVPECL and PCML, without the need for additional internal circuitry or external components.

There are several differential input standards in the industry. And each standard may have its own specification. For differential input specifications, the high power supply (Vcc), the common mode voltage levels (Vicm), and the differential input voltage (Vid), are the most important input operating conditions. For most differential input standards, the common mode voltage can be specified between 0 to 3.3 volts, and differential input voltage swings can be specified from 0.1 volts and up. Hysteretic amplifiers of the present invention that are used as input buffers can sense voltage differences Vid between differential input signals that are very small (typically, 0.1 volts or larger).

Figure 1:
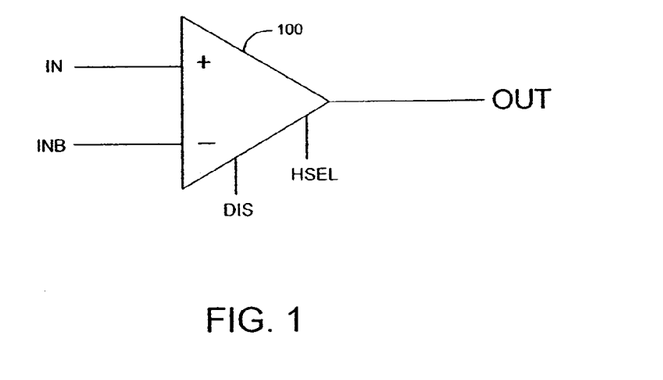
FIG. 1 illustrates a block diagram of a programmable hysteretic amplifier according to an embodiment of the present invention.

FIG. 1 illustrates a block diagram of a programmable hysteretic amplifier 100 according to a first embodiment of the present invention. Amplifier 100 receives two differential input voltages IN and INB. Amplifier 100 amplifies the difference between IN and INB to generate output voltage OUT. Amplifier 100 is responsive to two voltage control signals DIS (disable) and HSEL (hysteretic select). DIS controls whether amplifier 100 is hysteretic or non-hysteretic. If DIS sets amplifier 100 to be hysteretic, HSEL determines whether amplifier 100 has positive hysteresis or negative hysteresis.

Figure 2:
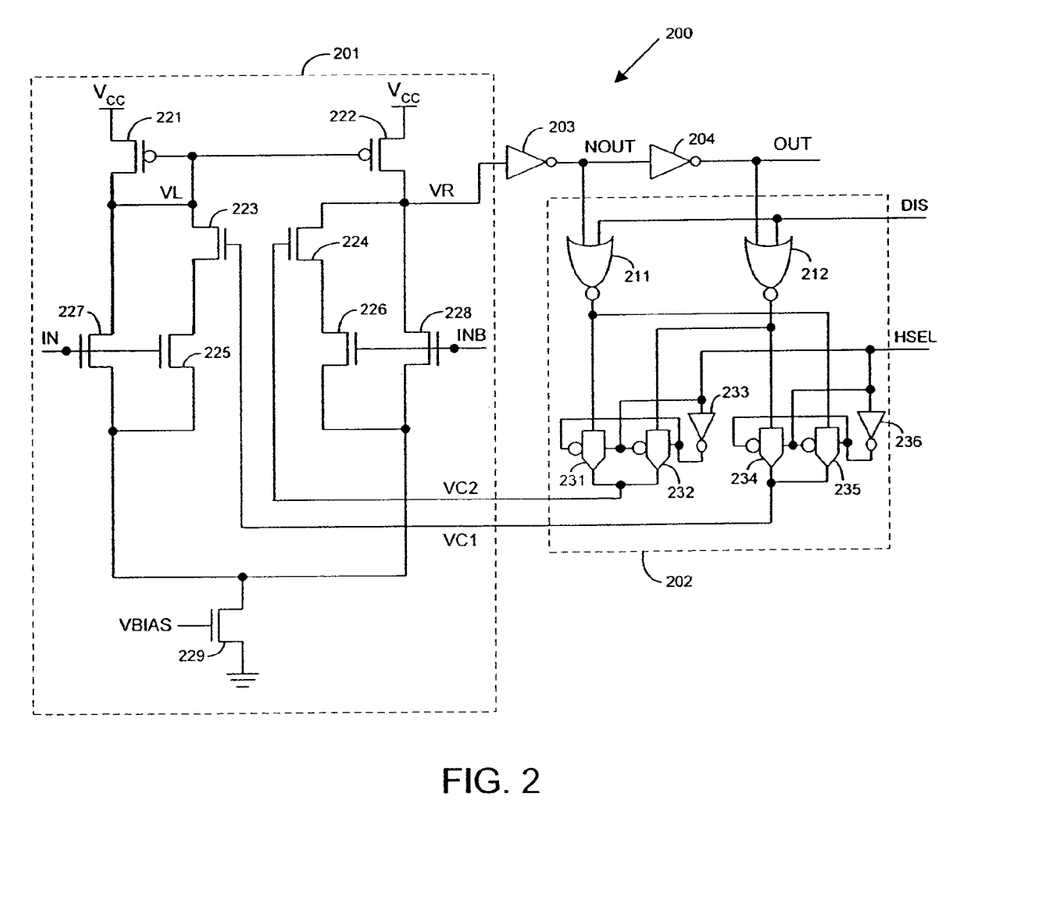
FIG. 2 illustrates a schematic diagram of a programmable amplifier with hysteresis according to one embodiment of the present invention.

FIG. 2 illustrates a schematic of a first embodiment of a programmable hysteretic amplifier 200 of the present invention. As with FIG. 1, IN and INB are the in-coming differential input signals. Amplifier 200 amplifies the difference between the input signals to drive output signal OUT. Amplifier 200 can be used as a comparator that drives OUT to a high or a low logic state. Amplifier 200 includes a differential amplifier stage 201, a multiplexer 202, and two inverters 203–204.

Amplifier 200 can have positive hysteresis, negative hysteresis, or no hysteresis. When amplifier 200 has no hysteresis, OUT switches when IN and INB have both reached a common voltage level. When amplifier 200 has positive hysteresis, output signal OUT switches at two hysteretic thresholds that both occur after IN and INB have crossed a common voltage level. When amplifier 200 has negative hysteresis, OUT switches at two hysteretic thresholds that both occur before IN and INB have crossed a common voltage level.

Figure 3A:
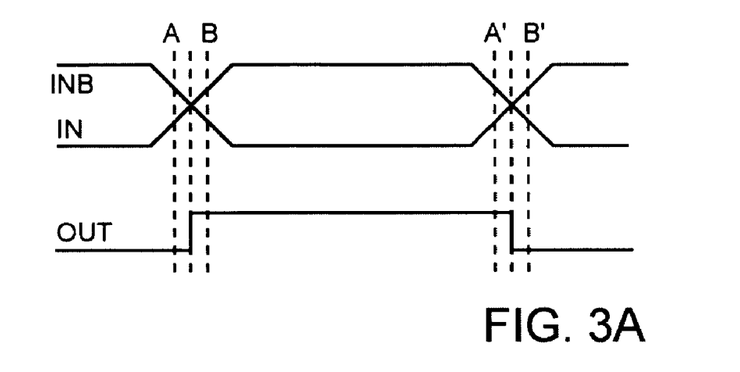
FIGS. 3A–3C illustrate examples of input and output signal waveforms for a programmable amplifier with hysteresis according to an embodiment of the present invention.
Figure 3B:
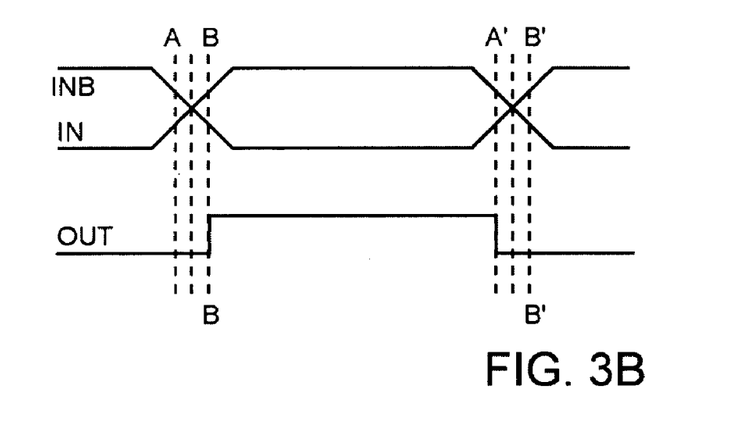
Figure 3C:
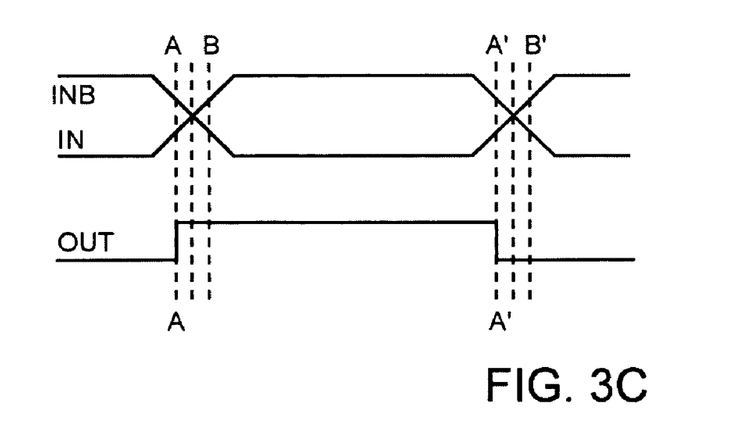

FIGS. 3A–3C illustrate examples of waveforms for differential input signals IN and INB and output signal OUT of amplifier 200. FIG. 3A illustrates IN, INB, and OUT when amplifier 200 has no hysteresis. FIG. 3B illustrates IN, INB, and OUT when amplifier 200 has positive hysteresis. FIG. 3C illustrates IN, INB, and OUT when amplifier 200 has negative hysteresis.

The voltage controls signals DIS and HSEL control the hysteretic input threshold voltages of amplifier 200. When DIS is set to a high voltage, the amplifier has only one input voltage threshold and therefore has no hysteresis. When DIS is low and HSEL is high, amplifier 200 has positive hysteresis. When DIS is low and HSEL is low, amplifier 200 has negative hysteresis. Dynamic hysteretic amplifiers of the present invention can be programmed with positive hysteresis to filter out input noises or with negative hysteresis to speed up data transmission.

Control signals DIS and HSEL can be statically set to the high supply voltage Vcc or to the low supply voltage Vss according to the preferred choice of setting. Alternatively, the control signals can be controlled by internal logic or by external signals programmed by a user. Programmable "CRAM" bits can also be used to control DIS and HSEL to provide flexible options for choosing the preferred voltage threshold combinations.

Differential amplifier stage 201 includes p-channel metal-oxide-silicon (PMOS) transistors 221–222 and n-channel (NMOS) transistors 223–229. Input signal IN is provided to the gates of transistors 225 and 227. Input signal INB is provided to the gates of transistors 226 and 228. Transistors 227–228 are a differential pair of transistors. Transistors 223–226 are coupled to differential input transistor pairs 227–228 to provide hysteresis. Transistor 229 is coupled to receive a bias voltage VBIAS. Transistor 229 controls the bias current through differential stage 201.

The gate of PMOS transistor 221 is coupled to is drain. The gates of PMOS transistors 221 and 222 are coupled together to form a current mirror. The drain of transistor 222 is coupled to the input of inverter 203.

When control signal DIS is high, amplifier 200 has only one input voltage threshold, and therefore, does not have hysteresis. In this mode, amplifier 200 operates the same way as a conventional differential amplifier. The switching logic of the input signals IN and INB is only recognized at their differential input crossing points when the input signal IN equals the input signal INB. When input signal IN is rising just slightly above the input signal INB, the output signal OUT is switched to a high voltage. When the input signal IN is falling slightly below the input signal INB, the output signal OUT is switched to a low voltage.

The operation of multiplexer 202 is now discussed. Multiplexer 202 includes NOR gates 211–212, transmission gates 231–232 and 234–235, and inverters 233 and 236. Control signal HSEL controls transmission gates 231–232 and 234–235. When HSEL is at a high voltage, transmission gates 231 and 234 are ON, and transmission gates 232 and 235 are OFF. When HSEL is at a low voltage, transmission gates 231 and 234 are OFF, and transmission gates 232 and 235 are ON.

When DIS is a high voltage, the output signals of NOR gates 211–212 are both at a low voltage, regardless of the values of voltages VR and NOUT. Voltages VC1 and VC2 are both low, whether HSEL is a high or low voltage. Because VC1 and VC2 are both low, transistors 223 and 224 remain off, and amplifier 200 does not exhibit hysteresis.

When DIS is set to a low voltage, positive or negative hysteresis can be selected by signal HSEL. When the input signals IN and INB are noisy, positive hysteresis can be selected by setting signal HSEL to a low voltage. With this setting, multiplexer 202 selects the signal NOUT to control transistor 223 through gate 235, and multiplexer 202 selects signal OUT to control transistor 224 through gate 232.

The operation of circuit 201 will now be discussed. First, assume that voltage IN is lower than voltage INB at startup, and the input signal IN is switching from a low-to-high voltage. Initially, voltage NOUT is high (Vcc) and voltage OUT is low (Vss). Transistor 223 is off and transistor 224 is on. During the upward transition of signal IN and the downward transition of signal INB, the voltage level at node VL is gradually falling, and the voltage at node VR is gradually rising.

Even when the input voltage IN equals voltage NB, voltage VR is lower than the voltage at VL, due to the extra current path though the transistors 224 and 226. Therefore, the output voltage OUT is still held at a stable value. The output voltage OUT is held low until the voltages IN and INB reach a first hysteretic threshold (point B on the waveforms in FIG. 3B). Because both transistors 221–222 always have the same control gate voltages, they both have the same drain-source current.

As voltage IN rises higher, the gate voltage of PMOS transistor 221–222 is pulled lower by transistor 227. Therefore, the drain-source currents of both transistors 221–222 are increasing. On the other side, as the input voltage INB is falling, the current through transistors 226 and 228 is decreasing. Voltage VL is pulled down lower by transistor 227, and voltage VR is pulled up higher by transistor 222.

VR is pulled up past the trip point of inverter 203 at the first hysteretic threshold (point B in FIG. 3B). When voltage VR is pulled up past the trip point of inverter 203, voltage NOUT is switched to low, and voltage OUT is switched to high by inverter 204. The signal VC1 is forced high by voltage NOUT to turn on transistor 223, and the signal VC2 is forced low by voltage OUT to turn off transistor 224. After voltages NOUT and OUT are already switched (at point B), the hysteresis path for voltage INB through transistor 224 is automatically turned off, and the hysteresis path for voltage IN is now automatically enabled by turning on transistor 223.

Consider when input signal IN is switching from high to low, and signal INB is switching from low to high. The positive hysteresis path through transistors 223 and 225 adds extra current to the drain-source current of transistor 227. The extra current through transistors 223 and 225 helps to maintain voltage VL low, until the voltages of IN and INB reach a second hysteretic threshold (point B' in FIG. 3B). At point B', the input signal IN is low enough to reduce the current through transistors 227 and 225. Voltage VL is then pulled up by transistor 221. Because the gate voltage of transistors 221–222 is now higher, the drain-source currents through transistors 221–222 are reduced.

As signal INB is raised higher, voltage VR is pulled down lower by transistor 228. When voltage VR is lower than the trip point of inverter 203, voltage NOUT is switched to high, and voltage OUT is switched to low. The next switching cycle is then repeated. Transistor 223 is turned off by signal VC1, and transistor 224 is turned on by signal VC2. Control signals VC1 and VC2 are gated from output signals NOUT and OUT, respectively, through multiplexer 202.

For faster delay time, amplifier 200 can be programmed to have negative hysteresis, by setting signal HSEL to a high voltage. As shown on the waveforms on FIG. 3C, the input sensing level is early at point A with negative hysteresis. Even before the input signals IN and INB cross a common voltage point, the output voltage OUT changes. Therefore, output voltage OUT can be switched with minimum or negative delay.

Assume that the differential input signals IN is low and INB is high at startup. By setting signal HSEL to a high voltage, multiplexer 202 selects voltage NOUT to control transistor 224 through gate 231, and multiplexer 202 selects voltage OUT to control transistor 223 through gate 234. Initially, signal NOUT is at a high voltage state, and signal OUT is at a low voltage state. When NOUT signal is high, VC2 is forced to a low voltage, turning off transistor 224. And when OUT is a low voltage, VC1 is forced to a high voltage to turn on transistor 223. The extra current path for negative hysteresis through transistor 225 is turned on by transistor 223.

As the differential input signals IN and INB are switching toward each other at point A on the waveform in FIG. 3C, the current through transistors 227 and 225 is gradually increasing, and the current through transistor 228 is gradually decreasing. Because the current controlled by the input signal IN has an extra current path through transistor 225, amplifier 200 can sense differential voltages between input signals IN and INB even before they each the same voltage level.

Once the output signal OUT is already switched to a high voltage, the hysteresis path controlled by transistor 223 is automatically turned off by signal VC1, and transistor 224 is automatically turned on by signal VC2 to enable the negative hysteresis path for the next input voltage transition.

As the negative hysteresis waveforms on FIG. 3C illustrate, the output signal OUT switched early at two different hysteretic threshold (point A and point A'). Transistors 225 and 226 directly control the switch points of signal OUT at point A and at point B. The bigger the W/L channel ratios of transistors 225 and 226, the further away points A and B in FIGS. 3A–3C are from the voltage crossing point of the differential input signals.

If transistors 225 and 226 are properly designed, amplifier 200 can be optimized to achieve a "zero" or "negative" delay time. The size of transistors 225 and 226 are preferably much smaller than the size of the transistors 227 and 228, respectively. To avoid output instability, the time delay of signals VC1 and VC2 should be larger than the edge rates of the differential input signals. The rise time of signals IN and INB from point A to B and from A' to B' should be less then the delay time for control signals VC1 and VC2 to pass through the decoding multiplexer 202.

The delay timing conditions for signals VC1 and VC2 are shown in equations (1) and (2). $T_{DELAY}$ is the delay for transitions in VC1 and VC2. $T_{RISE/IN}$ and $T_{RISE/INB}$ are the low-to-high rise times for input signals IN and INB, respectively. $T_{FALL/IN}$ and $T_{FALL/INB}$ are the high-to-low fall times for input signals IN and INB, respectively.

$$T_{DELAY} \geq T_{RISE/IN} \text{ and } T_{RISE/INB} \quad (1)$$

$$T_{DELAY} \geq T_{FALL/IN} + T_{FALL/INB} \quad (2)$$

Generally, in high speed applications, the differential edge rates of input signals IN and INB are very fast (e.g., hundreds of picoseconds). Therefore, the time delay for signals VC1 and VC2 to pass through decoding multiplexer 202 is already long enough.

In one embodiment, the width-to-length (W/L) channel ratios of transistors 221 and 227 are the same as transistors 222 and 228, respectively. The W/L channel ratio of transistor 225 is the same as the W/L ratio transistor 226. The W/L ratios of transistors 225–226 are much smaller than the W/L ratio of transistors 227 and 228. The W/L channel ratios of transistors 223 and 224 can be small because their gate voltages are pulled to the full values of the supply voltages.

The W/L channel ratios of transistors 225–226 can be scaled up or scaled down to adjust the hysteresis of amplifier 200. As the W/L ratios of transistors 225–226 are reduced, the difference between the hysteresis voltage thresholds VR+ and VR– is reduced. As the W/L ratios of transistors 225–226 are increased, the difference between the hysteresis voltage thresholds VR+ and VR– increases, and the ability of amplifier 200 to recognize the input data also increases.

Figure 4:
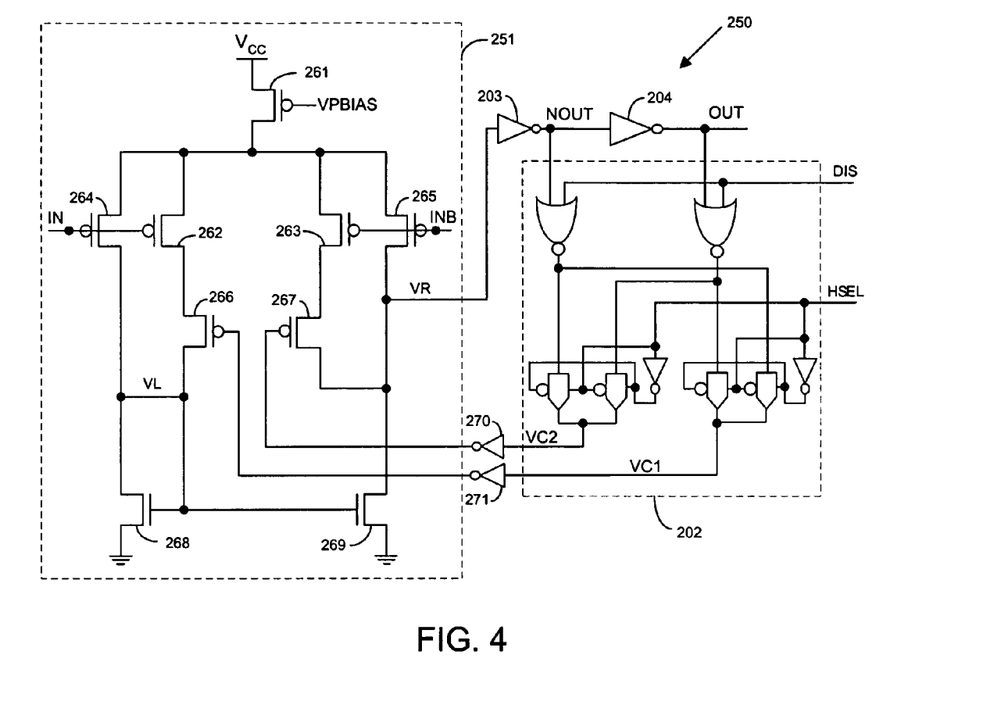
FIG. 4 illustrates a schematic diagram of a programmable amplifier with hysteresis according to another embodiment of the present invention.

FIG. 4 illustrates a second embodiment of a programmable hysteresis amplifier 250. Amplifier 250 includes multiplexer 202 and inverters 203–204, described above. Amplifier 250 also includes inverters 270–271 and differential stage 251. Control signals VC2 and VC1 are inverted by inverters 270–271, respectively. Differential stage 251 includes p-channel transistors 261–267 and n-channel transistors 268–269.

Transistor 261 receives voltage VPBIAS and provides bias current to stage 251. Transistors 262–265 receive input signals IN and INB. Transistors 262–263 and 266–267 add hysteresis to amplifier 250. Transistors 268–269 form a current mirror.

When signal HSEL is high, multiplexer 202 couples NOUT to the gate of transistor 267, and multiplexer 202 couples OUT to the gate of transistor 266. With HSEL high, amplifier 250 exhibits negative hysteresis (FIG. 3C). When signal HSEL is low, multiplexer 202 couples NOUT to the gate of transistor 266, and multiplexer 202 couples OUT to the gate of transistor 267. With HSEL low, amplifier 250 exhibits positive hysteresis (FIG. 3B).

Figure 5A:
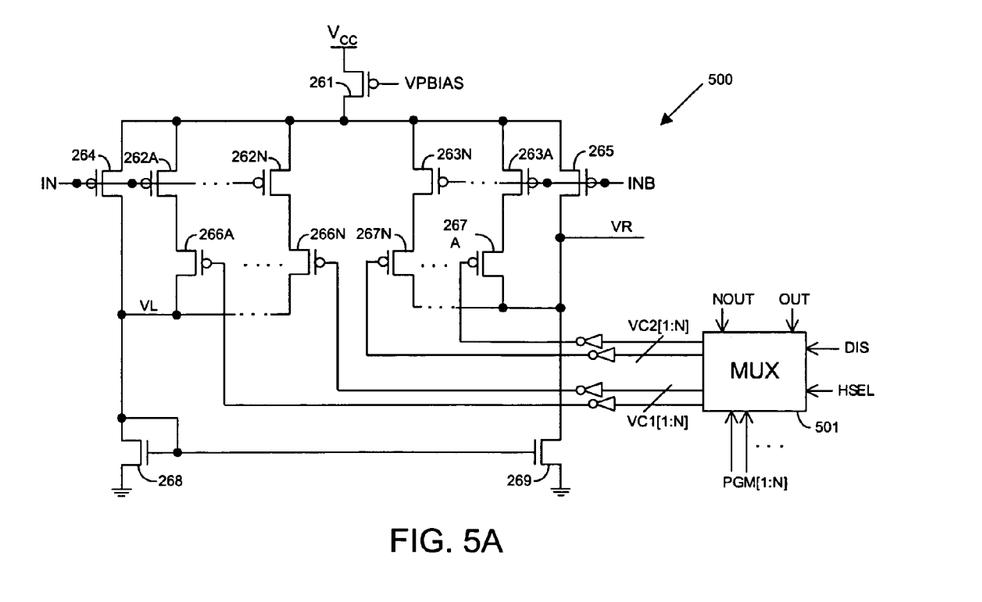
FIGS. 5A–5B illustrate schematic diagrams of programmable amplifiers with N sets of hysteretic threshold voltages according to other embodiments of the present invention.
Figure 5B:
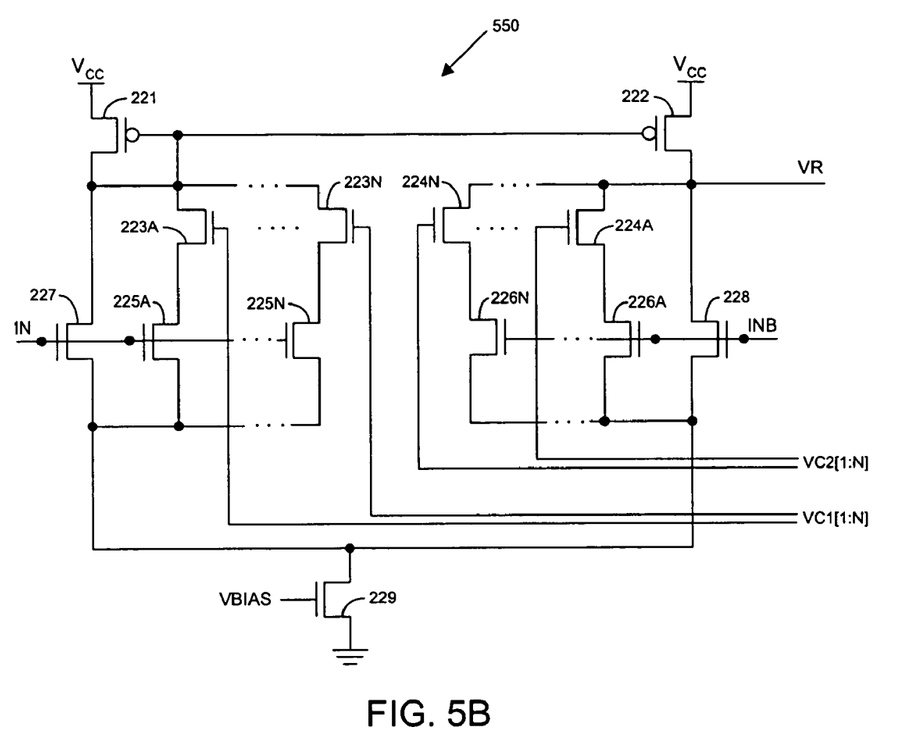

To make an amplifier of the present invention easier to optimize on silicon, multiple hysteresis paths can be used to achieve fine controls of the hysteresis. FIGS. 5A and 5B illustrate two examples of amplifiers 500 and 550 that have multiple hysteretic paths. Amplifier 500 shown in FIG. 5A has N hysteretic paths through p-channel transistors 262A–262N, 266A–266N, 263A–263N, and 267A–267N. N can be any suitable number (e.g., 2, 3, 4, etc.).

P-channel transistors 266A–266N are controlled by the inversion of N control signals VC1[1:N]. P-channel transistors 267A–267N are controlled by the inversion of N control signals VC2[1:N].

Multiplexer 501 generates control signals VC1[1:N] and VC2[1:N] in response to N program signals PGM[1:N], control signals DIS and HSEL, and output signals NOUT and OUT. When signal HSEL is high, multiplexer 501 couples NOUT to one or more of transistors 267A–267N, and multiplexer 501 couples OUT to one or more of transistors 266A–266N. With HSEL high, amplifier 500 exhibits negative hysteresis (FIG. 3C).

When signal HSEL is low, multiplexer 501 couples NOUT to one or more of transistors 266A–266N, and multiplexer 501 couples OUT to one or more of transistors 267A–267N. With HSEL low, amplifier 250 exhibits positive hysteresis (FIG. 3B). Signals PGM[1:N] determine how many of control signals VC1[1:N] and VC2[1:N] are allowed to go high to enable one or more of the hysteresis paths. For example, VC1 and VC2 remain at a low voltage when signal PGM1 is a low voltage, and transistors 266A and 267A remain off. With transistors turned 266A and 267A off, current through transistors 262A and 263A is blocked, regardless of the state of output signal OUT.

FIG. 5B illustrates a second embodiment of an amplifier 550 of the present invention that has multiple (N) hysteretic paths. The N hysteretic paths are through n-channel transistors 223A–223N, 224A–224N, 225A–225N, and 226A–226N. Transistors 225A–225N and 226A–226N receive control signals VC1 [1:N] and VC2[1:N], respectively. In amplifier 550, signals VC1[1:N] and VC2[1:N] are generated by multiplexer 501, but are not inverted. Program signals PGM[1:N] are set to enable one or more (or none) of the hysteretic paths through transistors 225A–225N and 226A–226N.

The positive and negative hysteretic threshold levels of amplifiers 500 and 550 are determined by the logic states of program signals PGM[1:N]. The logic states of program signals PGM[1:N] can be changed to the adjust the positive and negative hysteretic thresholds of amplifiers 500 and 550.

Figure 6:
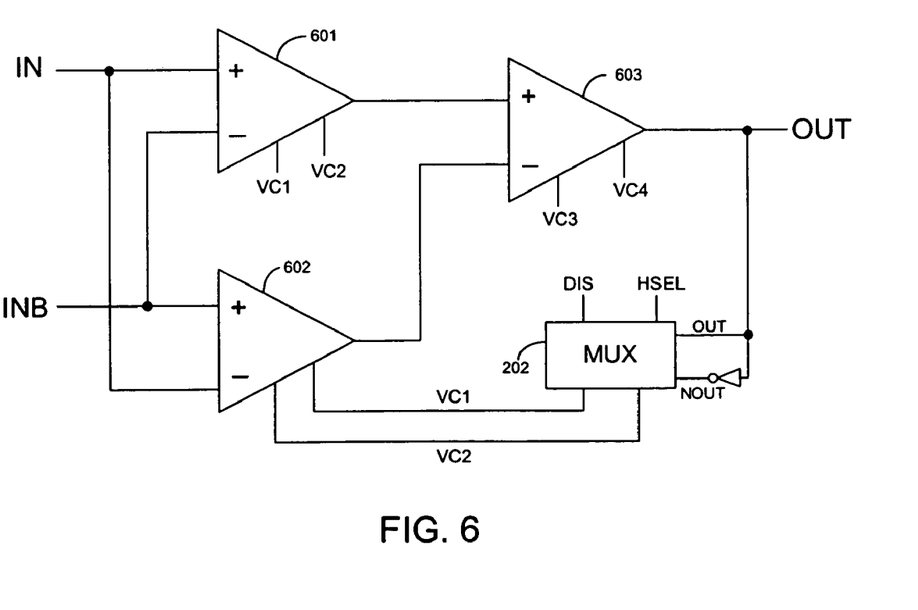
FIG. 6 illustrates a block diagram of three programmable hysteretic amplifiers according to another embodiment of the present invention.

FIG. 6 illustrates yet another embodiment of the present invention. The amplifier of FIG. 6 includes three programmable hysteretic amplifiers that are configured in two, dual-sensing stages. Amplifiers 601–603 can be configured as shown, for example, in FIGS. 2, 4, 5A, 5B, 7A, 7B, 8A, or 8B. Amplifiers 601–602 receive signals VC1 and VC2, which control their hysteretic threshold voltages. The hysteretic threshold voltages of amplifier 603 are controlled by additional control signals VC3 and VC4.

Amplifiers 601–602 are used to sense and pre-amplify small differential input signals (Vid≧0.1 volts) to improve performance at all common mode input levels from 0 volts to 3.3 volts. Amplifier 603 amplifies the differential output signals of amplifiers 601 and 602.

The amplifier of FIG. 6 is a two stage (dual sensing) amplifying scheme that is better able to sense small differential input voltages. The first stage includes amplifiers 601 and 602, and the second stage includes amplifier 603. The first stage pre-amplifies the differential input signals IN and INB, and the second stage amplifies the differential output signals of the first stage. Because the amplifier of FIG. 6 has two amplifying stages, each stage does not need to amplify its differential input signals to the full values of the supply voltages.

Because two amplifying stages are used, the transistors in amplifiers 601–603 can be designed to have very small sizes (i.e., channel W/L ratios) to reduce the layout area and current. When amplifying circuit of FIG. 6 is used as a receiver or input buffer, it is less sensitive to differential input voltage swings, and less sensitive to layout and process migration. Table 1 illustrates various hysteretic setting combinations that can be programmed into the circuitry of FIG. 6.

TABLE 1

| DIS | VC3 | HSEL | VC4 | Function Selected for Amps 601–602 | Function Selected For Amp 603 | Recommended Settings |
|---|---|---|---|---|---|---|
| 1 | 1 | — | — | Normal differential input | Normal differential input | — |
| 1 | 0 | — | 0 | Normal differential input | Positive hysteresis | — |
| 0 | 1 | 0 | — | Positive hysteresis | Normal differential input | — |
| 1 | 0 | — | 1 | Normal differential input | Negative hysteresis | For high speed applications |
| 0 | 1 | 1 | — | Negative hysteresis | Normal differential input | — |
| 0 | 0 | 0 | 0 | Positive hysteresis | Positive hysteresis | For very noisy environments |
| 0 | 0 | 0 | 1 | Positive hysteresis | Negative hysteresis | For high speed applications |
| 0 | 0 | 1 | 0 | Negative hysteresis | Positive hysteresis | — |
| 0 | 0 | 1 | 1 | Negative hysteresis | Negative hysteresis | — |

FIGS. 7A–7B and 8A–8B illustrate four additional embodiments of hysteretic amplifiers of the present invention. Each of these amplifiers has programmable hysteretic threshold levels that are controlled by signals VC1 and VC2, described above.

Figure 7A:
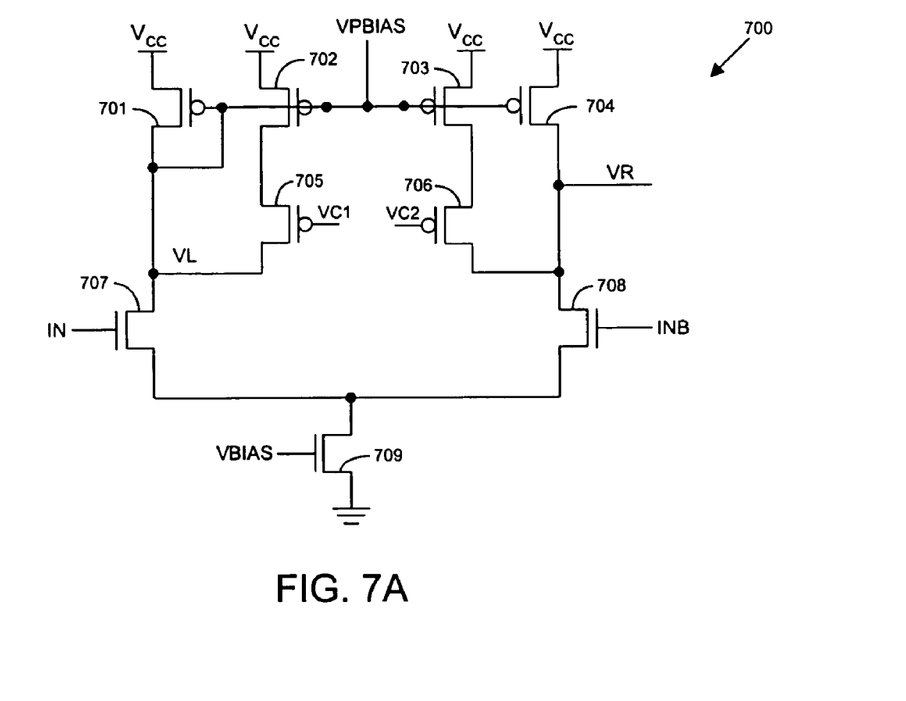
FIGS. 7A, 7B, 8A, and 8B illustrate schematic diagrams of additional programmable hysteretic amplifiers according to further embodiments of the present invention.

Hysteretic amplifier 700 shown in FIG. 7A includes p-channel transistors 701–706 and n-channel transistors 707–709. Input signals IN and INB are provided to the gates of transistors 707 and 708, respectively. Transistors 701–704 are driven by VPBIAS, and transistor 709 is driven by VBIAS. The hysteretic paths through transistors 705 and 706 are controlled by control signals VC1 and VC2, respectively.

Figure 7B:
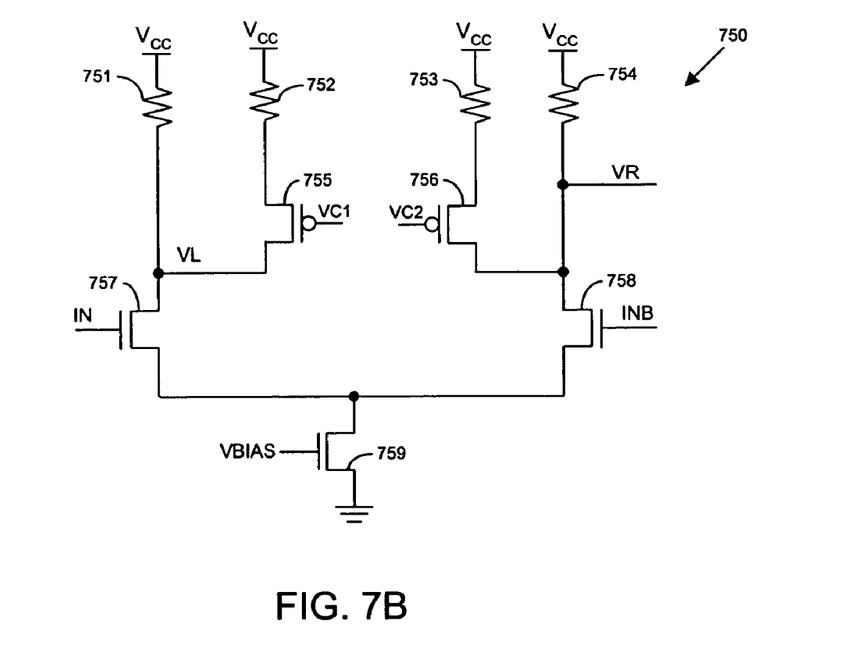

Hysteretic amplifier 750 shown in FIG. 7B includes resistors 751–754, p-channel transistors 755–756, and n-channel transistors 757–759. Input signals IN and INB are provided to the gates of transistors 757 and 758, respectively. Transistor 759 is driven by VBIAS. Transistors 755 and 756 are driven by control signals VC1 and VC2, respectively.

Figure 8A:
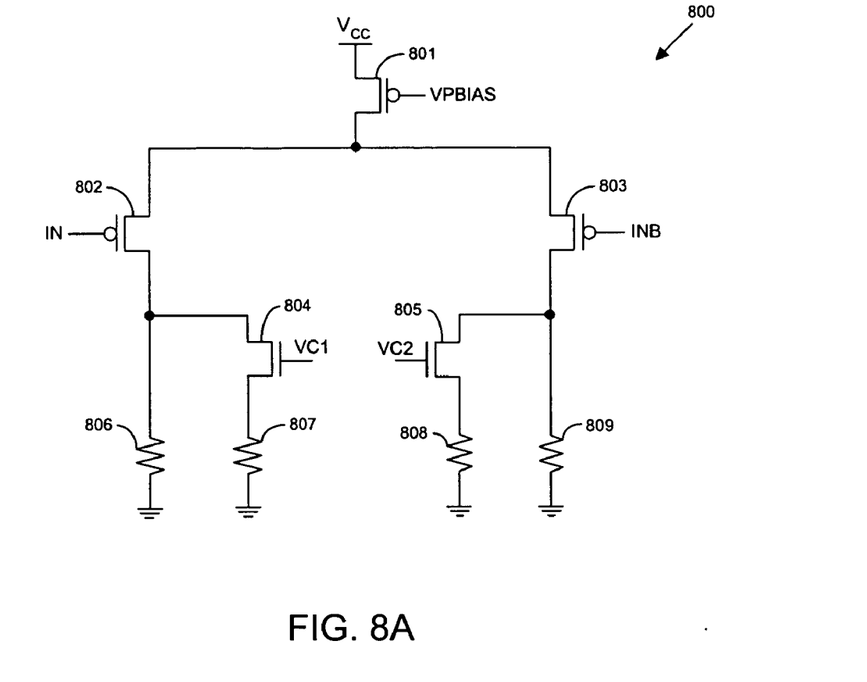

Hysteretic amplifier 800 shown in FIG. 8A includes resistors 806–809, n-channel transistors 804–805, and p-channel transistors 801–803. Input signals IN and INB are provided to the gates of transistors 802 and 803, respectively. Transistor 801 is driven by VPBIAS. Transistors 804 and 805 receive control signals VC1 and VC2, respectively.

Figure 8B:
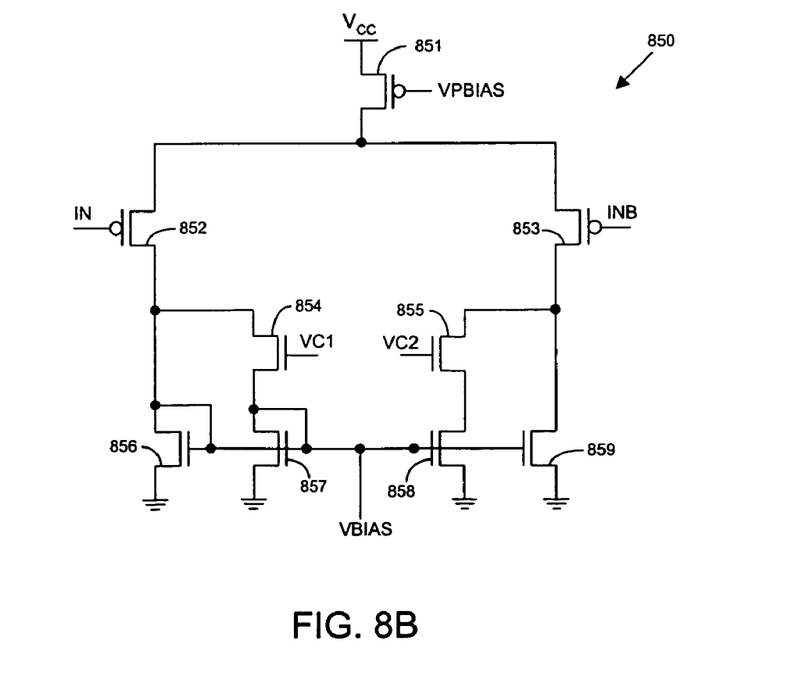

Hysteretic amplifier 850 shown in FIG. 8B includes p-channel transistors 851–853, and n-channel transistors 854–859. Input signals IN and INB are provided to the gates of transistors 852 and 853. Transistor 851 is driven by VPBIAS, and transistors 856–859 are driven by VBIAS. Transistors 854–855 are driven by VC1 and VC2, respectively.

Figure 9:
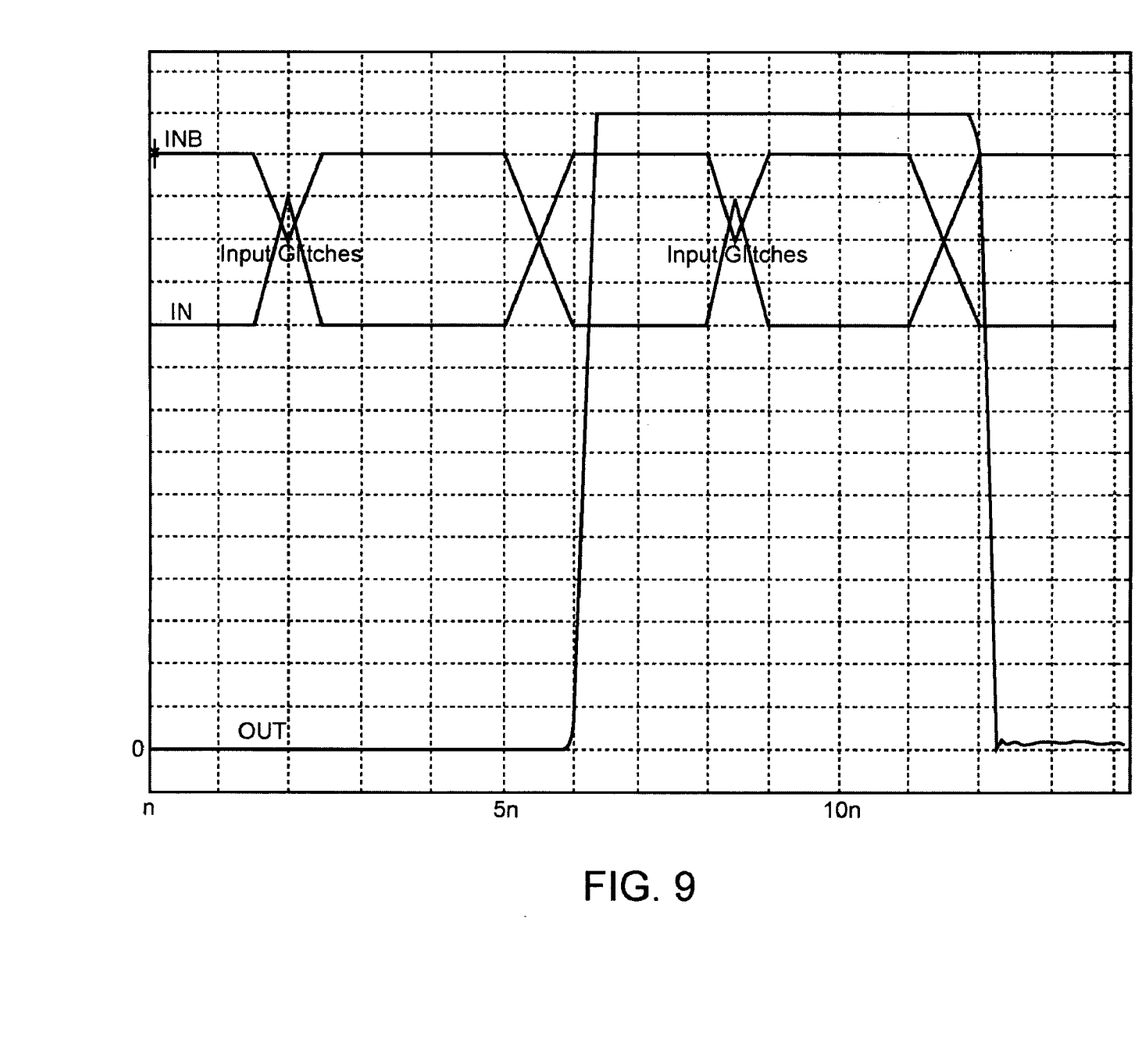
FIG. 9 illustrates examples of waveforms that demonstrate the insensitivity of a programmable hysteretic amplifier of the present invention to input voltage glitches.

FIG. 9 shows example waveforms for input signals IN and INB and output signal OUT when an amplifier of the present invention is configured with positive hysteresis. The differential input noises (also called input glitches) are filtered out by the amplifier with positive hysteresis. Only the correct data is transmitted to the output OUT.

In summary, with dual-sensing and hysteresis control techniques, the two stage amplifier of FIG. 6 can be used as an input buffer to support numerous differential input standards such as LVDS, LDT, LVPECL, and PCML without the need for additional internal circuitry or external components. A one stage amplifier of the present invention can also support several differential input voltage standards.

A hysteretic amplifier of the present invention can operate successfully across a wide range of supply voltages (e.g., from 0 to 3.3 volts). A hysteretic amplifier of the present invention can also operate a low minimum differential input voltage Vid (e.g., 0.1 volts).

Dynamic hysteretic amplifiers of the present invention can maintain a more stable 50% duty cycle across a wide range of common mode input voltage levels (e.g., from 0 to 3.3 volts) along with a low minimum input differential voltage Vid (e.g., 0.1 volts). For example, the amplifier of FIG. 6 has two stages that are better able to amplify small differential input voltages. As a result, the amplifier of FIG. 6 is better able to switch the transistors in an output inverter to the full supply voltages to maintain a good 50% duty cycle and to provide more uniform delay times.

The dual-sensing-and-amplifying circuit of FIG. 6 can be used to enhance small differential input signals from inputs IN and INB. All of the transistor sizes (i.e., their channel W/L ratios) in amplifiers 601–602 can be significantly reduced to save layout area and current. Because the small differential input signals are pre-amplified before being input into amplifier 603, the transistor sizes in amplifier 603 can also be reduced. Layout area and current are further reduced when using only one hysteretic amplifier stage as a differential input buffer as shown in FIG. 1.

Compared to many prior art old circuits, an input buffer of the present invention can be designed with smaller transistor sizes that reduce the layout area (e.g., by more than 50%). Because the transistor sizes are reduced, the current and input loadings are reduced in the amplifier. The power consumption and die area cost are also significantly reduced, and performance is also improved. Also, an amplifier of the present invention can more easily migrate to future semiconductor processes that have smaller device dimensions.

Hysteretic amplifiers of the present invention have a maximum frequency (Fmax) and a duty cycle that are very well maintained at all common mode voltage levels, even with worst case differential input voltage swings when Vid=0.1 volts. Positive hysteresis can be used to filter out differential input noises in a noisy environment. Negative hysteresis can be used to speed up data transmission for high speed applications.

An amplifier of the present invention is also less sensitive to process migrations than many prior art circuits. It is able to function fully in a 90 nanometer (nm) process as well as in older (0.13 or 0.15 micron) processes. The programmable hysteresis controls of the present invention provide flexible options that enable users to meet their needs for different applications.

Hysteretic amplifiers of the present invention can be used in integrated circuits such as application specific integrated circuits (ASICs) and programmable integrated circuits. Programmable integrated circuits include programmable logic devices (PLDs), field programmable gate arrays (FPGAs), programmable logic arrays, configurable logic arrays, etc.

Figure 10A:
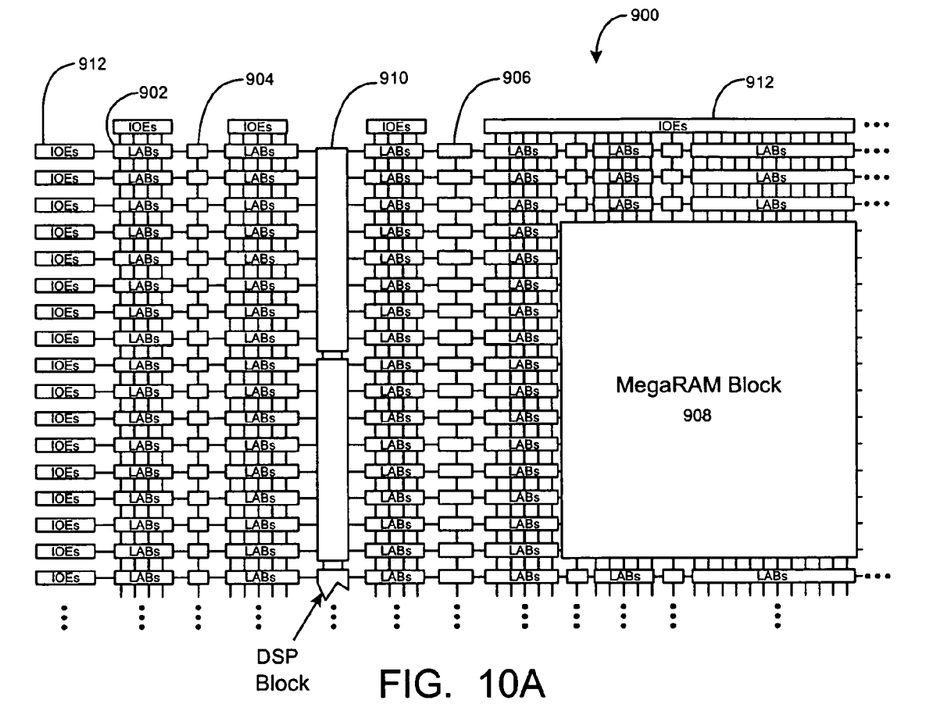
FIG. 10A is a simplified block diagram of a programmable logic device that can be used with the techniques of the present invention.

FIG. 10A is a simplified partial block diagram of a high-density PLD 900. PLD 900 is an example of a programmable integrated circuit in which techniques of the present invention can be implemented (e.g., as input buffers). PLD 900 includes a two-dimensional array of programmable logic array blocks (or LABs) 902 that are interconnected by a network of column and row interconnects of varying length and speed. LABs 902 include multiple (e.g., 10) logic elements (or LEs). An LE is a programmable logic block that provides for efficient implementation of user defined logic functions.

PLD 900 also includes a distributed memory structure including RAM blocks of varying sizes provided throughout the array. The RAM blocks can be control (CRAM) blocks. The RAM blocks include, for example, 512 bit blocks 904, 4K blocks 906 and a MegaBlock 908 providing 512K bits of RAM. These memory blocks can also include shift registers and FIFO buffers. PLD 900 further includes digital signal processing (DSP) blocks 910 that can implement, for example, multipliers with add or subtract features. I/O elements (IOEs) 912 located, in this example, around the periphery of the device support numerous single-ended and differential I/O standards. It is to be understood that PLD 900 is described herein for illustrative purposes only and that the present invention can be implemented in many different types of PLDs, FPGAs, and the like.

Figure 10B:
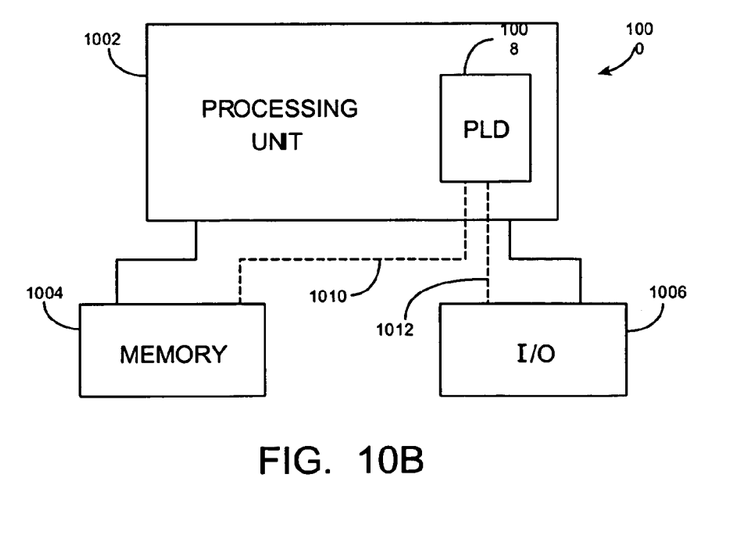
FIG. 10B is a block diagram of an electronic system that can implement embodiments of the present invention.

While PLDs of the type shown in FIG. 10A provide many of the resources required to implement system level solutions, the present invention can also benefit systems wherein a PLD is one of several components. FIG. 10B shows a block diagram of an exemplary digital system 1000, within which the present invention can be embodied. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004 and an I/O unit 1006 interconnected together by one or more buses. According to this exemplary embodiment, a programmable logic device (PLD) 1008 is embedded in processing unit 1002. PLD 1008 can serve many different purposes within the system in FIG. 10B. PLD 1008 can, for example, be a logical building block of processing unit 1002, supporting its internal and external operations. PLD 1008 is programmed to implement the logical functions necessary to carry on its particular role in system operation. PLD 1008 can be specially coupled to memory 1004 through connection 1010 and to I/O unit 1006 through connection 1012.

Processing unit 1002 can direct data to an appropriate system component for processing or storage, execute a program stored in memory 1004 or receive and transmit data via I/O unit 1006, or other similar function. Processing unit 1002 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 1008 can control the logical operations of the system. In an embodiment, PLD 1008 acts as a reconfigurable processor, which can be reprogrammed as needed to handle a particular computing task. Alternately, programmable logic device 1008 can itself include an embedded microprocessor. Memory unit 1004 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A hysteretic amplifier comprising:
   a first differential pair of first and second transistors receiving first and second input voltages and generating and a first output voltage;
   third and fourth transistors coupled to the first and second transistors, respectively, and coupled to receive first and second control signals, respectively; and
   a multiplexer that generates the first and the second control signals in response a hysteretic select signal,
   wherein the multiplexer causes the hysteretic amplifier to have positive hysteresis when the hysteretic select signal is in a first state, and the multiplexer causes the hysteretic amplifier to have negative hysteresis when the hysteretic select signal is in a second state.

2. The hysteretic amplifier as defined in claim 1 wherein the multiplexer causes the hysteretic amplifier to not have hysteretic input thresholds when a disable signal is in a first state.

3. The hysteretic amplifier as defined in claim 1 further comprising:
   fifth and sixth transistors coupled in parallel to the third and fourth transistors, respectively, and coupled to receive third and fourth control signals, respectively,
   wherein the first, the second, the third, and the fourth control signals are generated by the multiplexer in response to the hysteretic select signal and a plurality of program signals.

4. The hysteretic amplifier as defined in claim 1 further comprising:
   fifth and sixth transistors coupled to the third and fourth transistors, respectively, and coupled to receive the first and second input voltages.

5. The hysteretic amplifier as defined in claim 1 wherein the hysteretic amplifier is an input buffer coupled to receive input signals from an input pin of an integrated circuit.

6. The hysteretic amplifier as defined in claim 5 wherein the integrated circuit is a field programmable gate array.

7. The hysteretic amplifier as defined in claim 1 further comprising:
   a second differential pair of fifth and sixth transistors receiving the first and the second input voltages and generating and a second output voltage; and
   seventh and eighth transistors coupled to the fifth and sixth transistors, respectively, and coupled to receive the first and the second control signals, respectively.

8. A method for amplifying an input signal, the method comprising:
   amplifying a difference between first and second input signals to generate an output signal;
   causing the output signal to change state at first and second hysteretic thresholds when a hysteretic select signal is in a first state, the first and second hysteretic thresholds occurring after the first and second input signals cross a common point; and
   causing the output signal to change state at third and fourth hysteretic thresholds when the hysteretic select signal is in a second state, the third and fourth hysteretic thresholds occurring before the third and fourth input signals cross the common point.

9. The method according to claim 8 further comprising:
   causing the output signal to change state at a fifth non-hysteretic threshold level when a disable signal is in a first state.

10. The method according to claim 8 wherein the first the second, the third, and the fourth hysteretic threshold levels are adjustable by changing logic states of a plurality of program signals.

11. The method according to claim 8 further comprising:
    selecting the output signal as a first control signal and selecting an inversion of the output signal as a second control signal when the hysteretic select signal is in a first state; and
    selecting the inversion of the output signal as the first control signal and selecting the output signal as the second control signal when the hysteretic select signal is in a second state.

12. A hysteretic amplifier comprising:
    means for amplifying a difference between first and second input signals to generate and an output signal;
    means for generating first and second control signals in response a hysteretic select signal and the output signal,
    means for switching a level of the output signal at first and second positive hysteretic thresholds when a hysteretic select signal is in a first state; and
    means for switching the level of the output signal at third and fourth negative hysteretic thresholds when the hysteretic select signal is in a second state.

13. The hysteretic amplifier according to claim 12 further comprising:
    means for switching the level of the output signal at a fifth non-hysteretic threshold when a disable signal is in a first state.

14. The hysteretic amplifier according to claim 12 further comprising:
    means for switching the level of the output signal at a fifth positive hysteretic threshold when the hysteretic select signal is in the first state and a first program signal is in a first state; and
    means for switching the level of the output signal at a sixth negative hysteretic threshold when the hysteretic select signal is in the second state and a second program signal is in a first state.

15. The hysteretic amplifier according to claim 12 wherein the hysteretic amplifier is an input buffer coupled to receive input signals from an input pin of an integrated circuit.

* * * * *